(12) United States Patent
Oremus et al.

(10) Patent No.: US 9,978,624 B2
(45) Date of Patent: May 22, 2018

(54) DEVICE FOR AT LEAST EMPTYING A TRANSPORT CONTAINER

(71) Applicant: Mechatronic Systemtechnik GmbH, Villach (AT)

(72) Inventors: Alexander Oremus, Villach (AT); Arno Glantschnig, Reichersdorf (AT)

(73) Assignee: Mechatronic Systemtechnik GmbH, Villach (AT)

( * ) Notice: Subject to any disclaimer, the term of this patent is extended or adjusted under 35 U.S.C. 154(b) by 0 days. days.

(21) Appl. No.: 15/036,472

(22) PCT Filed: Nov. 17, 2014

(86) PCT No.: PCT/EP2014/074814
§ 371 (c)(1),
(2) Date: May 13, 2016

(87) PCT Pub. No.: WO2015/071475
PCT Pub. Date: May 21, 2015

(65) Prior Publication Data
US 2016/0293470 A1  Oct. 6, 2016

(30) Foreign Application Priority Data

Nov. 15, 2013 (EP) ..................................... 13193220

(51) Int. Cl.
*B65H 3/48* (2006.01)
*H01L 21/677* (2006.01)
(Continued)

(52) U.S. Cl.
CPC ...... *H01L 21/67778* (2013.01); *B65G 59/005* (2013.01); *B65G 59/04* (2013.01);
(Continued)

(58) Field of Classification Search
CPC .... B65G 59/04; B65G 59/005; B65H 3/0816; B65H 3/0883; B65H 3/48; B65H 5/08;
(Continued)

(56) References Cited

U.S. PATENT DOCUMENTS 2,878,016 A * 3/1959 Russell .................... B65H 3/08
271/11
5,018,936 A * 5/1991 Izumi ................. H05K 13/0417
198/395
(Continued)

FOREIGN PATENT DOCUMENTS

DE           44 31 072 C1 *  1/1996  ............... B65H 3/38
DE    10 2012 102 239 A1    9/2013
(Continued)

OTHER PUBLICATIONS

International Search Report of PCT/EP2014/074814, dated Feb. 11, 2015, (7 pages).

*Primary Examiner* — Mark J Beauchaine
(74) *Attorney, Agent, or Firm* — Collard & Roe, P.C.

(57) ABSTRACT

A device for at least emptying a transport container having a stack of plate-shaped items, including semiconductor wafers and/or packaging material, includes at least one measuring device and a holder at least part of which can travel into the transport container. The holder has a holding surface, a number of holding nozzles for at least holding an item in the stack, and, in the region of the holding surface, at least one recess for the measuring device for acquiring measurement data from the item in the stack. At least one separating nozzle is arranged on the holder outside the holding surface such that the nozzle(s) can move between rest and separating positions. In the separating position, a gas stream directed towards the end face of the stack is (Continued)

formed, to release at least one item in the stack that is adhered to the item held by the holder.

17 Claims, 4 Drawing Sheets

(51) Int. Cl.
| | |
|---|---|
| *H01L 21/67* | (2006.01) |
| *H01L 21/68* | (2006.01) |
| *H01L 21/683* | (2006.01) |
| *B65G 59/00* | (2006.01) |
| *B65G 59/04* | (2006.01) |
| *G01B 11/14* | (2006.01) |
| *B65H 3/08* | (2006.01) |

(52) U.S. Cl.
CPC .............. *B65H 3/48* (2013.01); *G01B 11/14* (2013.01); *H01L 21/67092* (2013.01); *H01L 21/681* (2013.01); *H01L 21/6838* (2013.01); *B65H 3/0816* (2013.01); *B65H 3/0883* (2013.01)

(58) Field of Classification Search
CPC .......... B65H 5/14; B65H 5/222; B65H 5/228; B65H 3/08; B65H 7/16; H01L 21/67778; H01L 21/6838; H01L 21/681; G01B 11/14

See application file for complete search history.

(56) References Cited

U.S. PATENT DOCUMENTS

| | | | |
|---|---|---|---|
| 6,345,818 | B1 | 2/2002 | Stephan et al. |
| 7,307,689 | B2 * | 12/2007 | Du Mee ................ F16C 29/025 355/53 |
| 8,172,288 | B2 * | 5/2012 | Jonas ................... B25J 15/0616 294/64.3 |
| 2006/0090848 | A1 | 5/2006 | Koga et al. |
| 2015/0066199 | A1 * | 3/2015 | Shimono ................ B65G 59/04 700/218 |

FOREIGN PATENT DOCUMENTS

| | | | | |
|---|---|---|---|---|
| DE | 102012102239 A1 | * | 9/2013 | .......... H01L 21/683 |
| WO | 01/03893 A1 | | 1/2001 | |
| WO | 2004/019387 A1 | | 3/2004 | |
| WO | 2007/058693 A1 | | 5/2007 | |
| WO | 2008/117928 A1 | | 10/2008 | |
| WO | 2008/145085 A1 | | 12/2008 | |
| WO | 2009/074297 A2 | | 6/2009 | |
| WO | 2011/010683 A1 | | 1/2011 | |

* cited by examiner

DEVICE FOR AT LEAST EMPTYING A TRANSPORT CONTAINER

CROSS REFERENCE TO RELATED APPLICATIONS

This application is the National Stage of PCT/EP2014/074814 filed on Nov. 17, 2014, which claims priority under 35 U.S.C. § 119 of European Application No. 13193220.4 filed on Nov. 15, 2013, the disclosure of which is incorporated by reference. The international application under PCT article 21(2) was not published in English.

TECHNICAL FIELD

The invention relates to an apparatus for at least emptying a transport container, which is provided with a stack of plate-shaped objects comprising semiconductor wafers and/or packaging material, with at least one measuring device, with a holder, which can be inserted at least partly into the transport container and which is provided with a holding surface, several holding nozzles for at least holding an object of the stack and, in the region of the holding surface, at least one recess for the measuring device for acquisition of measured data from the object of the stack.

PRIOR ART

Apparatuses with nozzles for pick-up of substrates and equipped with measuring devices are known from the prior art (WO01/03893A1, WO2008/145085A1). For example WO2008/145085A1 describes an apparatus with a holder, a holding surface with nozzles for developing the Bernoulli effect, in order to pick up semi conductor wafers therewith, and with a measuring device. The measuring device is a capacitive sensor, which projects through a region of the holding surface in order to detect the correct pick-up of the semiconductor wafer attached by suction. A disadvantage of this apparatus is that it is not capable of correctly picking up both semiconductor wafers and packaging materials, for example, films, paper or plastic foam. This represents a problem in particular when the apparatus must grip semiconductor wafers, which are packaged as a stack for transport. This problem is increasingly magnified by the fact that packaging material may remain adhering to the semiconductor wafer due to adhesion forces, thus interfering with piece-by-piece emptying of the transport container. In addition, damage to the semiconductor wafer during emptying cannot be ruled out if, for example, semiconductor wafers are also withdrawn during removal from the stack and then drop back onto the stack or fall somewhere else from the holder.

In addition, for separation of stacked semiconductor wafers, it is known (DE102012102239A1) to use a separating nozzle, which generates a directional gas stream on an end face of the substrate stack. As an alternative to raising the stack, the separating nozzle can be lowered relative to a stationary stack in order to follow the reduced stack height that results when a holder with suction nozzles has lifted a substrate from the stack. In the case of holders with suction nozzles, such a construction with a movable separating nozzle or movable stack disadvantageously needs exact control and alignment of separating nozzle relative to the stack, in order not to disturb the function of the suction nestles of the holder by the gas stream of the separating nozzle.

OUTLINE OF THE INVENTION

The task of the invention is therefore, starting from the prior art depicted in the introduction, to provide a constructively simply designed device, which is suitable for safe emptying of a transport container containing semiconductor wafers.

The invention accomplishes the task by the fact that the holder is provided with at least one separating nozzle, disposed on the holder outside the holding surface so as to be movable from a resting position into a separating position in such a way that, in the separating position, the separating nozzle generates a gas stream, directed onto the end face of the stack, in order to loosen at least one other object of the stack adhering to the object held by the holder.

If the holder is provided with at least one separating nozzle, disposed on the holder outside the holding surface so as to be movable from a resting position into a separating position in such a way that, in the separating position, the separating nozzle generates a gas stream directed onto the end face of the stack, it can be ensured that, independently of parameters of the stack, especially its stack height, etc., that another object of the stack adhering to the object held by the holder is not dragged along by the holder. In particular, the separating nozzle disposed movably on the holder moves together with the holder to the object of the stack to be picked up, whereby this separating nozzle positioned together with the holder can always occupy the required separating position. Thus the position of the separating nozzle relative to the stack in space can be determined extremely accurately by the holder positioned in space relative to the object to be picked up. This can be further improved since, with the measuring device, data on how the holder is positioned relative to the object can be obtained and considered for more accurate adjustment of the separating position of the separating nozzle. Thereby the steadiness of the holder can be greatly improved. In this way it can be ensured that an object picked up from the stack or being held is free of adhering other objects of the stack, and is so independently of the stack height and/or stack position. In particular, the precisely directed gas stream can always overcome adhesion forces between the objects of the stack and thus ensure piece-by-piece lifting of objects of the stack. The apparatus according to the invention is therefore particularly suitable for safe emptying of a transport container containing semiconductor wafers. Packaging materials such as films, paper, plastic foam or the like can therefore be separated safely from the semiconductor wafer. In addition, in this way the semiconductor wafers can also be protected from damage that may occur due to dragging along of other removed objects. In this way it is possible to provide an apparatus that is constructively simply designed but nevertheless is formed robustly and steadily during emptying of a transport container.

In general, it is pointed out that the apparatus is not limited to transport containers for semiconductor wafers and packaging material but instead other objects can also be provided in these stacks.

The invention can be constructively simplified when the holder is provided with at least one pneumatic cylinder, which is connected to the separating nozzle, in order to displace it or move it back and forward from its resting position into the separating position.

If the separating nozzle and the pneumatic cylinder are connected to a common compressed-air line, further constructive simplifications and therefore cost savings can be achieved. In particular the working medium of the separating nozzles can also be used for the pneumatic cylinder, whereby a more cost-effective apparatus can be obtained. If in addition the dynamic pressure at the separating nozzle is correspondingly high, so that the pneumatic cylinder is still held in its working position—corresponding to the separating position of the nozzle—at this pressure, separating nozzle and pneumatic cylinder can be activated more simply via a common valve. In addition, by suitable dimensioning of nozzle and cylinder, pulsed gas streams can be produced with simultaneous movement of the cylinder and thus of the separating nozzle. In this way the possibility can be created of achieving particularly effective separation between the object held by the holder and the adhering other object of the stack.

If a first guide for displacement of the separating nozzle from the resting into the separating position and back is provided between holder and at least one separating nozzle, the separating nozzles can be moved particularly precisely. A linear guide can be characterized as particularly well suited for this.

If the separating nozzle is disposed behind the holding surface in resting position and in front of it in separating position, this can simplify the function of the apparatus considerably. For example, a withdrawn separating nozzle can simplify insertion and retraction of the holder or the positioning of the holder in the transport container. Moreover, because of the possible avoidance of parts projecting from the holding surface, the danger of damage to the stacked objects by the holder can be reduced.

It may prove advantageous for safe holding of the objects if the holding nozzles are provided with several Bernoulli nozzles on the holding surface and several vacuum nozzles in the rim region of the holding surface. In this connection, separate activation or actuation of these Bernoulli nozzles and vacuum nozzles may be advantageous. In this way it may be possible to perform different gripping and holding processes with one and the same apparatus. For example, the Bernoulli nozzles can be used for gripping the topmost object of the stack, and the vacuum nozzles activated only when the object is lying on the holding surface. Naturally it is also possible to imagine applications in which the vacuum nozzles are turned on first or in which vacuum nozzles and Bernoulli nozzles are turned on simultaneously. Under certain circumstances, an apparatus that is provided with several separately activatable groups of nozzles, wherein the individual groups of nozzles are arranged circularly on the holding surface, may be particularly advantageous. In this way the process of separation of the adhering object can be favored even more by means of the various activated nozzle groups.

If a second guide for displacement of the vacuum nozzles is provided between the vacuum nozzles and the holder in a gripping position protruding from the holding surface, the apparatus according to the invention may prove effective for picking up the most diverse objects. For example, the movably mounted vacuum nozzles can be displaced in the direction of the object to be gripped, in order to hold it firmly. If the Bernoulli nozzles on the holding surface are made to admit a fluid for generation of a negative pressure, the object to be gripped can be simultaneously pulled onto the holding surface by the negative pressure. With incipient curvature of the object held in this way, an adhering and stiffer object lying underneath it can be partly loosened. This can be used in particular for detachment of paper from the semiconductor wafer, whereby even delicate objects can be safely gripped as well as lifted individually from the stack. In general, it is pointed out that, even during displacement of the guided vacuum nozzles back into a highest position level with the holding surface, the handling of the apparatus can remain unimpaired, because in this way overhanging parts, which would have to be considered during movement of the apparatus, can be avoided.

These advantages can be further improved by providing at least one Bernoulli nozzle centrally on the holding surface, since thereby the negative pressure for pick-up of the object is much more intense at the center of the holding surface and in the further course of events a particularly favorable curvature can be developed in the object to be picked up.

If the measuring device is provided with a first device for measurement of the distance, especially laser measurement of the distance between holding surface and object to be picked up, the distance between these can be determined rapidly and accurately in this way—by the fact that the distance measurement is moved together with the holder. Consequently, the holder can be brought into the optimum position for the pick-up process or for the acquisition of data from the object to be picked up. In addition, by means of this accurate position recognition, the holder and thus the separating nozzle can be controlled such that the gas stream directed toward the end face of the stack can be generated at the correct height, namely between object to be picked up and the object of the stack adhering to it. Thus the possibility is created of making the separation process even more effective and safer.

If the measuring device is provided with a second device having an image sensor for acquisition of image data from the object to be picked up, the object of the stack to be picked up can be accurately identified on the basis of the obtained image data, which may result in better reliability of determination of the type of object to be picked up than is known for capacitive sensors. For example, it is hardly possible for a capacitive sensor to recognize the difference between a semiconductor wafer and a semiconductor wafer on which an 80 μm thin paper layer is lying as a packaging material referred to as interleave. It is only by the acquisition of image data that the exact distinction between various packaging materials and semiconductor wafers is possible. In addition, in the interaction with the first device for distance measurement, advantages can be achieved with the second device for acquisition of image data by the fact that it is possible to focus on the object better due to accurate distance measurement. Thereby the image-data acquisition can be performed much more accurately. In general, it is specified that the evaluation of the image data can take place both in the device for acquisition of image data and in an external control device, which controls the entire apparatus. For example, merely by a simple evaluation of the averaged RGB values of the image data, it is possible to infer the color of the object. Depending on the objects of the stack to be distinguished, this alone may already be a sufficient distinguishing feature. In addition, with sufficiently high resolution of the image data, it is also possible to infer the surface structure of the object, whereby a further distinguishing feature can be determined. The use, for acquisition of image data, of a device having a learning mode for recognition and programming of certain materials is also conceivable. During operation, the device can then signal the inserted object, identified on the basis of surface and color, via digital outputs of a controller. Thus the various objects of the stack (semiconductor wafer, paper, film, plastic foam, etc.) can be correctly recognized and accordingly correctly picked up, separated and held.

If the first and second devices record measured and image data via the common opening in the holder, this can act advantageously on the gripping and holding properties of the apparatus by virtue of a reduced cut-out area on the holding surface. In particular, the object to be held can then be held more stably and thus more steadily on the apparatus by means of the holding nozzles. In general, it must be pointed out that the measurement of the various sensors through an opening can take place sequentially or else in parallel. The choice of the suitable method may be dependent on a possible mutual influence of the sensors, but also of the efficiency of the controller of the apparatus.

If at least one of the measuring devices records the measured and/or image data via a deflection mirror, the respective measuring device can be installed parallel to the alignment of the holding surface, which may permit a more compact overall shape of the apparatus. In general, it is pointed out that, with corresponding miniaturization of the measuring devices, direct installation of the measuring device in the holder is naturally also conceivable.

If the measuring device is equipped with a capacitive sensor provided in an opening, the successful pick-up and holding of an object can be monitored.

If the separating position of the separating nozzle can be adjusted as a function of the measured-data acquisition of the measuring device from the object of the stack, the separation of adhering objects can be even further improved. For example, with recognition of the wafer it is possible to infer its thickness and thus to adapt the separating position of the separating nozzle.

BRIEF DESCRIPTION OF THE DRAWING

The subject matter of the invention will be illustrated in more detail by way of example on the basis of an alternative embodiment in the figures, wherein.

WAY OF WORKING OF THE INVENTION

Figure 1:
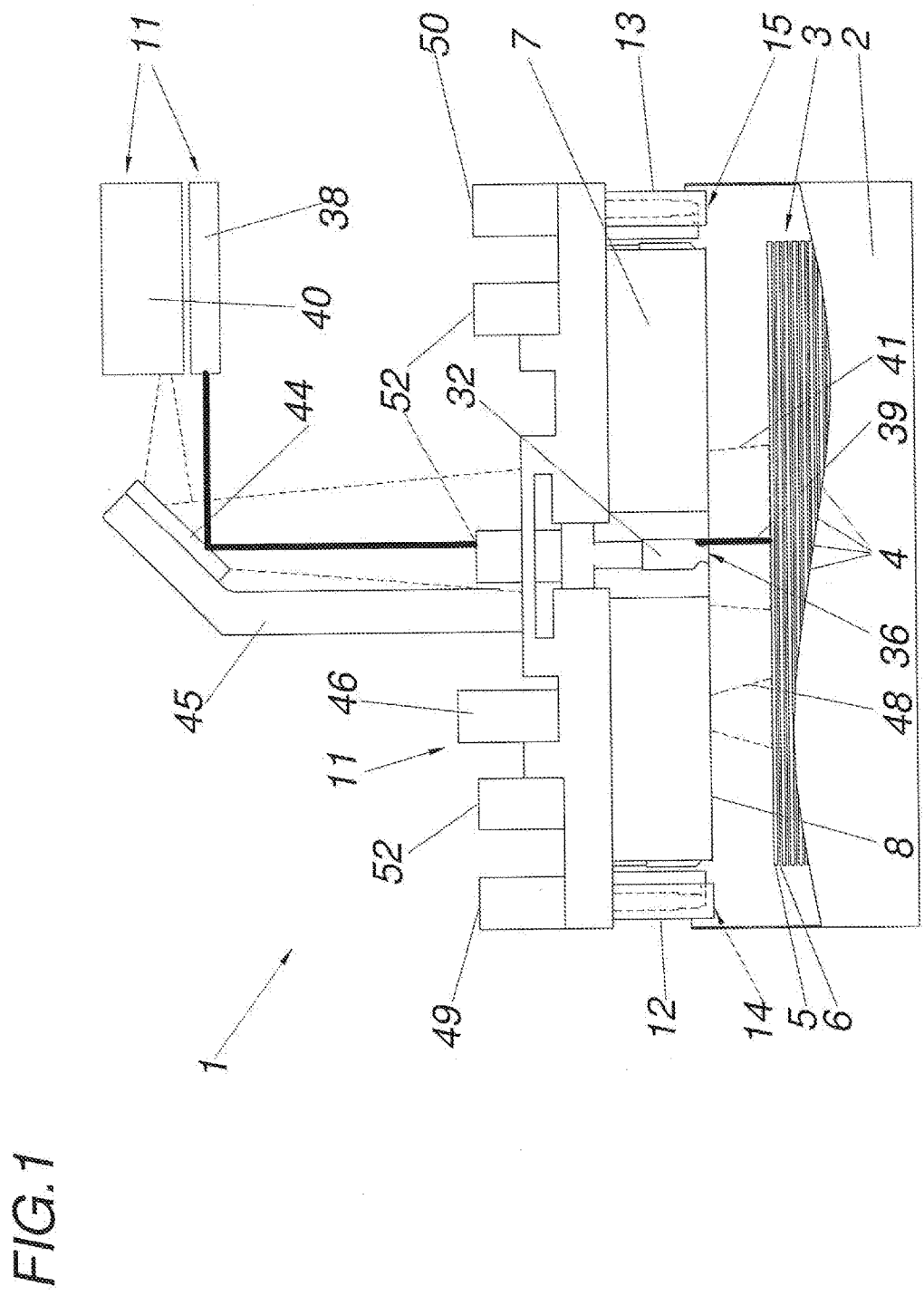
FIG. 1 shows a front view of the apparatus with partly cut-away transport container

According to FIG. 1, a front view of an exemplary apparatus 1 is shown together with a partly cut-away transport container 2. A cylindrical stack 3 of round and plate-shaped objects 4 is disposed in the transport container 2. The objects 4 are packaged semiconductor wafers 5 and packaging material 6, which are stacked in alternating manner in a transport container 2. In addition, the apparatus 1 is provided with a holder 7, on the holding surface 8 of which several holding nozzles 9—as can be seen in FIG. 9—are disposed. A recess 10 for receiving a measuring device 11, which is suitable for the acquisition of measured data of an object 4 of the stack 3, is provided in the region of the holding surface 8.

According to the invention, two diametrically disposed, movably mounted separating nozzles 12, 13 are provided, which according to the invention are disposed outside the holding surface 8 on the holder 7, in order to ensure piece-by-piece emptying of the transport container 2 therewith. A linearly movable mounting of the separating nozzles 12, 13, the resting position 14, 15 of which is illustrated in FIG. 1, is advantageous for this purpose.

Figure 3:
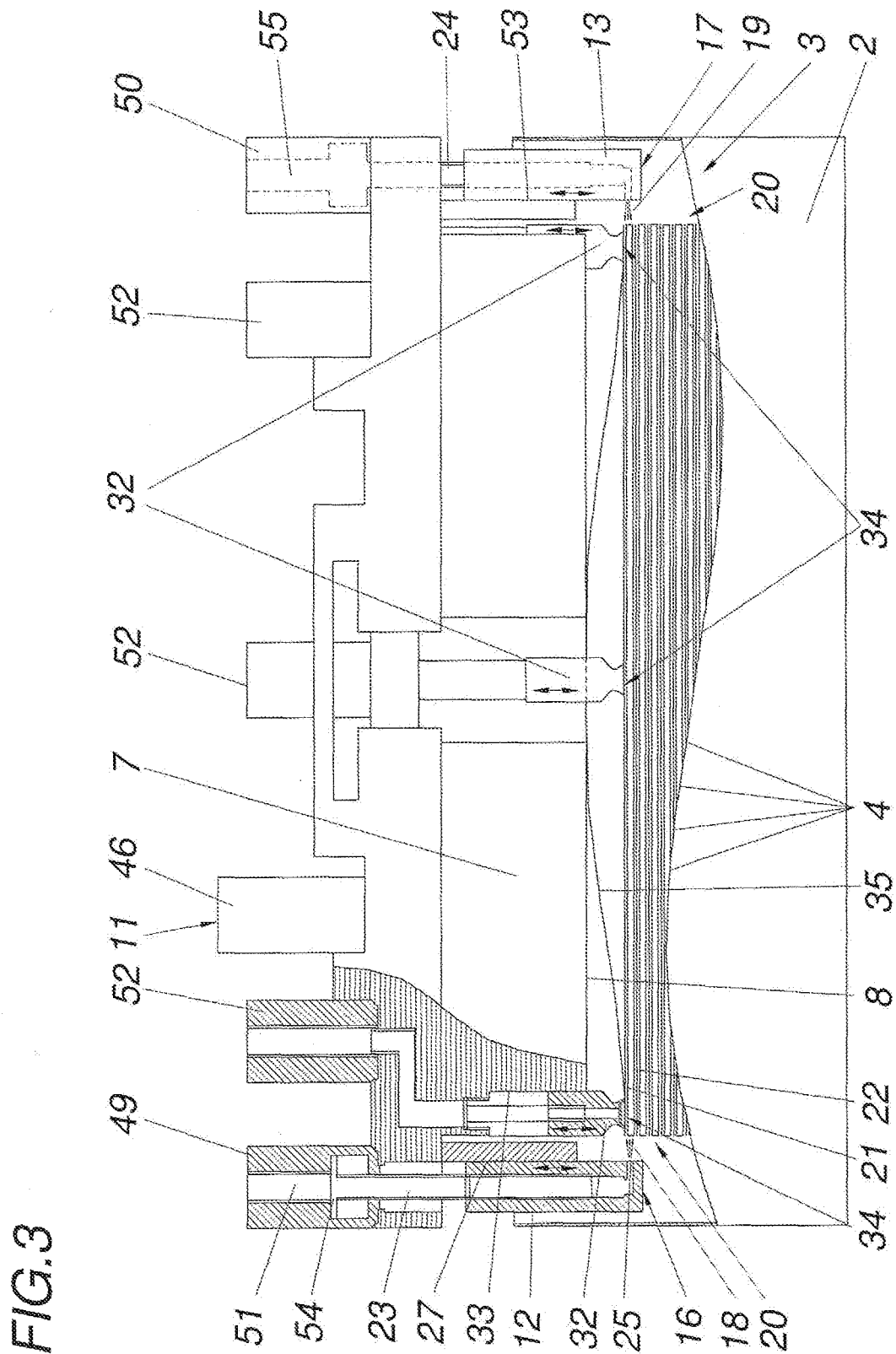
FIG. 3 shows a partly cut-away front view of the apparatus with the nozzles in separating and gripping position and with partly cut-away transport container and FIG. 4 shows an enlarged section of the nozzles in separating and gripping position of FIG. 3
Figure 4:
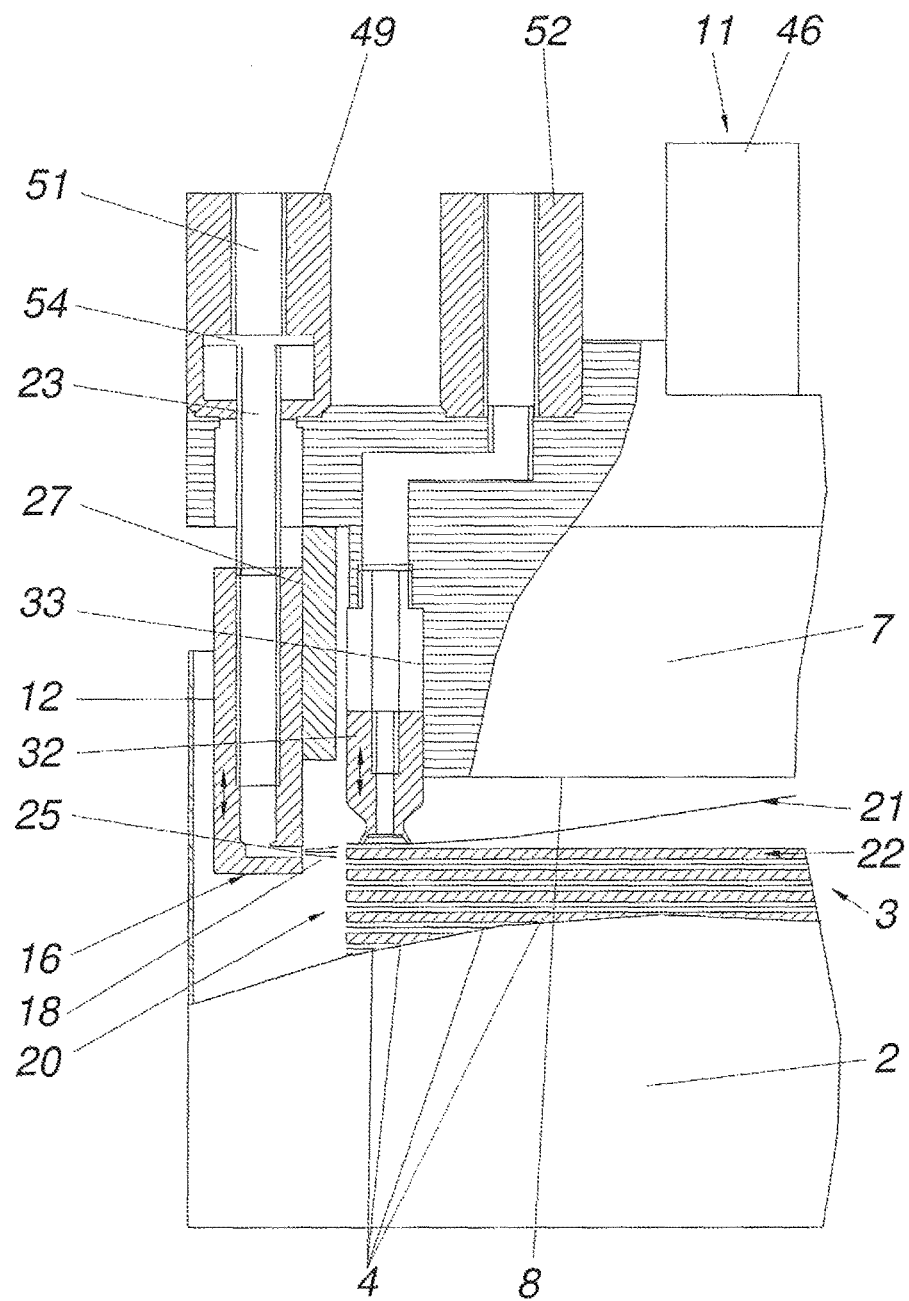

Corresponding to FIG. 3 or FIG. 4, the separating nozzles 12, 13 can be seen in the separating position 16, 17, wherein they generate gas streams 18, 19 in the direction of end face 20 of the stack 3. The gas streams 18, 19 in the direction of the end face 20 of the stack 3 can penetrate between object 21 held by the holder 7 and the other object 22 of the stack 3 adhering thereto. Accordingly, the adhesion forces between the objects 21, 22 of the stack 3 are overcome by means of these gas streams 18, 19 in the separating positions 16, 17 of the separating nozzles 12, 13. Due to this achieved loosening of the two objects 21, 22 from one another, the apparatus 1 is able to execute the picking-up and holding, according to the invention, of an object 21 from the stack 3 of the transport box 2, without inadvertently also holding an adhering object 22 or in the further course of events possibly dragging semiconductor wafers 5 along and thus damaging them. In addition, the occupation of the separating positions 16, 17 of the separating nozzles 12, 13 is simple and thus steady, because the position of the separating nozzles 12, 13 relative to the stack 3 in space can be determined extremely accurately by the holder 7 positioned in space opposite the object 21 to be picked up. The measured-data acquisition of the measuring device 11 from the topmost object 21 of the stack 3 is also used to adjust the separating positions 16, 11 of the separating nozzles 12, 13 even more accurately, for example via a controller, not illustrated in more detail, on holder 7, in data communication with the measuring device 11.

According to FIG. 3 or FIG. 4, the apparatus is provided with pneumatic cylinders 23, 24 for displacement of the separating nozzles 12, 13 from the resting position 14, 15 into the separating position 16, 17. Since the separating nozzles 12, 13 generate a gas stream 18, 19 in any case for the solution of the task according to the invention, they must be supplied accordingly with a gas via the compressed-air ports 49, 50. This can be used simultaneously as working medium for the pneumatic cylinders 23, 21. Such synergy effects usually result in savings and thus in a more cost-effective apparatus 1.

As illustrated in FIG. 4, further synergy effects are achieved when the separating nozzle 12 and the pneumatic cylinder 23 are connected to a common compressed-air line 51. Thus the pneumatic cylinder 23 is open downward and simultaneously supplies the nozzle orifice 25. A prerequisite for this is that the dynamic pressure at the nozzle orifice 25 is so high that the pneumatic cylinder 23 is still held in its working position—corresponding to the separating position 16 of the separating nozzle 12—at this pressure. In this way separating nozzle 12 and pneumatic cylinder 23 are activated constructively simply by a common valve 54. Besides the cost-reducing effects on the apparatus 1, pulsed gas streams with simultaneous movement of the separating nozzle 12 are achieved in simple and elegant manner by this arrangement together with suitable dimensioning of nozzle orifice 25 and cylinder 23. Thus a particularly effective loosening can be achieved between the object 21 held by the holder 7 and the other adhering object 22 of the stack 3.

The linear guides 27, 53 are used for displacement of the separating nozzle 12, 13 from the resting position 14, 15 into the separating position 16, 17 and back again. Accordingly, the separating nozzles 12, 13 in resting position 14, 15 can be inserted into a position covered by the holder 7. This facilitates or permits the partial insertion and retraction, without problems, of the holder 7 in the transport box 2 and also the pick-up of the objects 4 of the stack 3 close to the bottom, because overhanging parts of the holding surface 8 are avoided.

Figure 2:
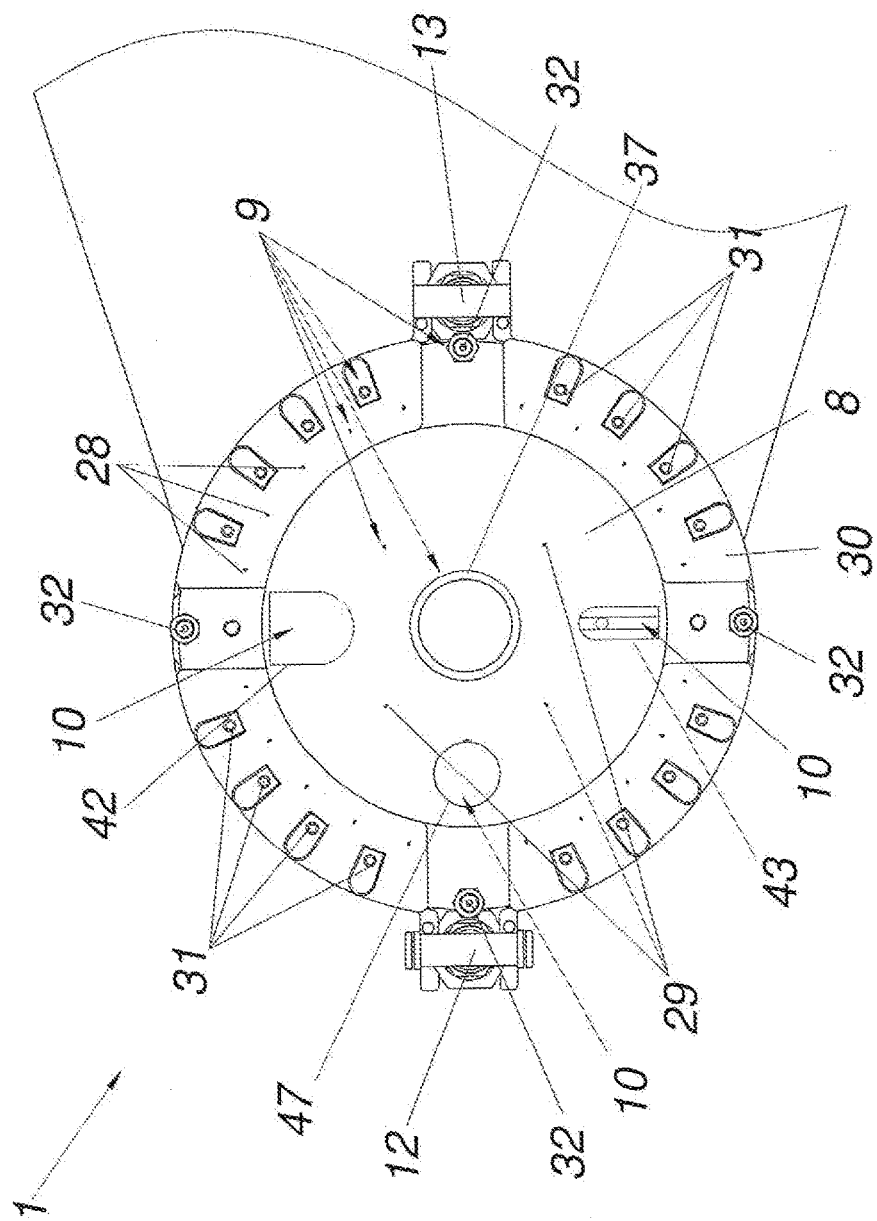
FIG. 2 shows a view of the apparatus from underneath

According to FIG. 2, the view of the apparatus 1 from underneath is shown. On holding surface 8, the holding nozzles 9 are divided into separately activatable groups of nozzles 28, 29, 31, 32, wherein the individual groups of nozzles 28, 29, 31, 32 are circularly disposed. In the exemplary embodiment shown, several Bernoulli nozzles 28, 29 are in groups in the inner region of the holding surface 8 and vacuum nozzles 31, 32 are in groups in the rim region 30. By means of this nozzle configuration, different gripping and holding processes can be carried out. For example, depending on the topmost object 21 of the stack 3, the Bernoulli nozzles 28, 29 can be used for gripping, and the vacuum nozzles 31, 32 for holding the object. In addition, the separation according to the invention is further improved by the fact that nozzle groups are activated at different times depending on the topmost object 4 of the stack 3. As can be interred from FIGS. 1 and 3, the vacuum nozzles 32 are supplied via the ports 52.

According to FIG. 4 it is evident that the vacuum nozzles 32 are mounted movably on guides 33. By means of these, the vacuum nozzles 32 can be displaced into a gripping position 34 protruding from the holding surface 8. This gripping position 34 is suitable in particular for picking up a thin object 21, for example of paper, from the stack 3, since as shown in FIG. 3 this can be held in the rim region with the vacuum nozzles at a distance from the holder 7. If the Bernoulli nozzles 28, 29 on the holding surface 8 are activated to generate a negative pressure, the object 21 to be gripped is simultaneously drawn by the negative pressure onto the holding surface 8 and in gripping position 34 is held at a distance from the holding surface 8 by the movably mounted vacuum nozzles 32. Because of these pressure conditions, a curvature 35, which results in partial loosening of the underlying and possibly also adhering object 22, is developed in a thin object 21 to be gripped. If the movably mounted separating nozzles 12, 13 are now additionally in their separating position 16, 17 and generating a gas stream 18, 19 in the direction of end face 20 of the stack 3, object 21 to be picked up and underlying object 22 adhering thereto are simply separated from one another—the movably mounted vacuum nozzles 32 are displaced back to their starting position 36 according to FIG. 1.

According to FIG. 2, a further circle of Bernoulli nozzles 37 is provided centrally on the holding surface 8. By means of these the curvature 35 toward the middle of the object 21 to be picked, up can be made more distinct and the separation further simplified or improved.

According to FIG. 1, the measuring device 11 is provided with a laser distance measurement 38. The distance 39 between holder 7 and object 21 to be picked up is determined with this. Thus an exact positioning of the apparatus 1 for the pick-up process or for the acquisition of data from the object 21 to be picked UP is assured. The exact distance measurement 38 is particularly important for the exact positioning of the holder 7 in interaction with the separating nozzles 12, 13 in separating position 16, 17. In particular, it can be ensured in this way that the gas streams 18, 19 impinge on the end face 20 of the stack 3 at the correct height, i.e. corresponding to between object 21 to be picked up and the object 22 of the stack 3 adhering thereto.

Moreover, a further device, namely one having an image sensor 40 for acquisition of image data 41 from the object 21 to be picked up, is evident in FIG. 1 at the measuring device 11. The topmost object 21 of the stack 3 is identified with the recorded image data 41 and this information is used for the gripping and holding process. Thus the apparatus can be operated automatically, depending on the topmost object 21 of the stack 3, with the best possible activation of the separating nozzles 12, 13 and holding nozzles 9. In addition, the acquisition of image data 41 in interaction with the laser distance measurement 38 functions particularly advantageously since, due to the accurate distance measurement 38, the device 40 for acquisition of image data 41 can focus optimally on the object 21 and thus acquire more significant image data 41.

As illustrated in FIG. 1, the laser distance measurement 38 and image sensor 40 record measured data 39 and image data 41 via a common opening 42 in the holder 9. Thereby the remaining holding surface 8 is larger in the further course of events, wherewith more stable holding of the object 21 is achieved. For the case that the measuring devices could influence one another disadvantageously, the measurement via a further optional opening 43, as shown by the dashed lines in FIG. 2, is naturally also conceivable.

The deflection mirror 44 shown in FIG. 1, which is fastened to a mirror retainer 45, permits the arrangement of the measuring devices 11 parallel to the alignment of the holding surface 8. In this way a more compact construction of the apparatus 1 can be achieved.

According to FIG. 1, the measuring device 11 is additionally provided with a capacitive sensor 46 in an opening 47. The capacitive sensor 46 determines measured data 48, which make it possible to infer whether pick-up and holding of an object 21 have been successful, and it is used for monitoring the gripping and holding process.

The invention claimed is:

1. An apparatus for at least emptying a transport container, which is provided with a stack of plate-shaped objects comprising at least one of semiconductor wafers and packaging material, the apparatus comprising:
   (a) at least one measuring device; and
   (b) a holder insertable at least partly into the transport container, said holder comprising:
      a holding surface;
      a plurality of holding nozzles for at least holding a first object of the stack;
      in the region of the holding surface, at least one recess for the measuring device for acquisition of measured data from the first object of the stack; and
      at least one separating nozzle, disposed on the holder outside the holding surface so as to be movable from a resting position into a separating position in such a way that, in the separating position, the at least one separating nozzle generates a gas stream directed onto an end face of the stack, in order to loosen at least a second object of the stack adhering to the first object held by the holder;
   wherein the separating position of the separating nozzle is adjusted as a function of the measured-data acquisition of the measuring device from the first object of the stack.

2. The apparatus according to claim 1, wherein a first guide for displacement of the at least one separating nozzle from the resting position into the separating position and back is provided between the holder and the at least one separating nozzle.

3. The apparatus according to claim 1, wherein the at least one separating nozzle is disposed behind the holding surface in the resting position and in front of the holding surface in the separating position.

4. The apparatus according to claim 1, wherein the measuring device is equipped with a capacitive sensor provided in an opening.

5. The apparatus according to claim 1, wherein the holder is provided with at least one pneumatic cylinder, which is connected to the at least one separating nozzle in order to displace it.

6. The apparatus according to claim 5, wherein the at least one separating nozzle and the pneumatic cylinder are connected to a common compressed-air line.

7. The apparatus according to claim 1, wherein the holding nozzles are provided with several Bernoulli nozzles on the holding surface and several vacuum nozzles in a rim region of the holding surface.

8. The apparatus according to claim 7, wherein a second guide for displacement of the vacuum nozzles into a gripping position protruding from the holding surface is provided between the vacuum nozzles and the holder.

9. The apparatus according to claim 7, wherein at least one Bernoulli nozzle is provided centrally on the holding surface.

10. The apparatus according to claim 1, wherein the measuring device is provided with an image device having an image sensor for acquisition of image data from the first object to be picked up.

11. The apparatus according to claim 10, wherein the image device records image data via an opening in the holder.

12. The apparatus according to claim 10, wherein the image device records image data via a deflection mirror.

13. The apparatus according to claim 1, wherein the measuring device is provided with a first device for measurement of the distance between the holding surface and the first object to be picked up.

14. The apparatus according to claim 13, wherein the first device records measured data via an opening in the holder.

15. The apparatus according to claim 13, wherein the first device records the measured data via a deflection mirror.

16. The apparatus according to claim 13, wherein the measuring device is provided with an image device having an image sensor for acquisition of image data from the first object to be picked up,
   wherein the first device and the image device record measured and image data via a common opening in the holder.

17. The apparatus according to claim 13, wherein the measuring device is provided with an image device having an image sensor for acquisition of image data from the first object to be picked up,
   wherein the first device and the image device record measured and image data via a deflection mirror.

* * * * *